(12) United States Patent
Kanamori

(10) Patent No.: US 6,414,346 B1
(45) Date of Patent: Jul. 2, 2002

(54) SEMICONDUCTOR MEMORY AND MANUFACTURING METHOD THEREOF

(75) Inventor: Kohji Kanamori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/767,568

(22) Filed: Jan. 23, 2001

(30) Foreign Application Priority Data

Jan. 24, 2000 (JP) ..................................... 2000-015107

(51) Int. Cl.$^7$ ............................................ H01L 27/108
(52) U.S. Cl. ......................... 257/296; 257/68; 257/314
(58) Field of Search ......................... 365/185.18, 185, 365/185.01; 257/314, 68; 438/3

(56) References Cited

U.S. PATENT DOCUMENTS

| 4,888,734 A | * 12/1989 | Lee et al. ................... 365/185 |
| 5,467,305 A | * 11/1995 | Bertin et al. ............ 365/185.01 |
| 5,693,971 A | * 12/1997 | Gonzalez ................... 257/314 |
| 6,130,102 A | * 10/2000 | White, Jr. et al. ............... 438/3 |
| 6,249,454 B1 | * 6/2001 | Sung et al. ............ 365/185.18 |

FOREIGN PATENT DOCUMENTS

JP 6283721 10/1994

* cited by examiner

*Primary Examiner*—David Nelms
*Assistant Examiner*—Thinh Nguyen

(57) ABSTRACT

A semiconductor memory is provided with a memory cell region and a peripheral circuit region. The memory cell region includes semiconductor memory cells arranged in an array and element separating shield electrodes. The element separating shield electrodes extend in a column direction and separate semiconductor memory cells being adjacent to each other in a row direction. Further, a peripheral circuit sending and receiving data to and from the semiconductor memory cell is provided in the peripheral circuit region. Elements in the peripheral circuit are separated by an element separation insulating film. The element separating shield electrodes extend onto the element separation insulating film at a boundary between the memory cell region and the peripheral circuit region.

13 Claims, 14 Drawing Sheets

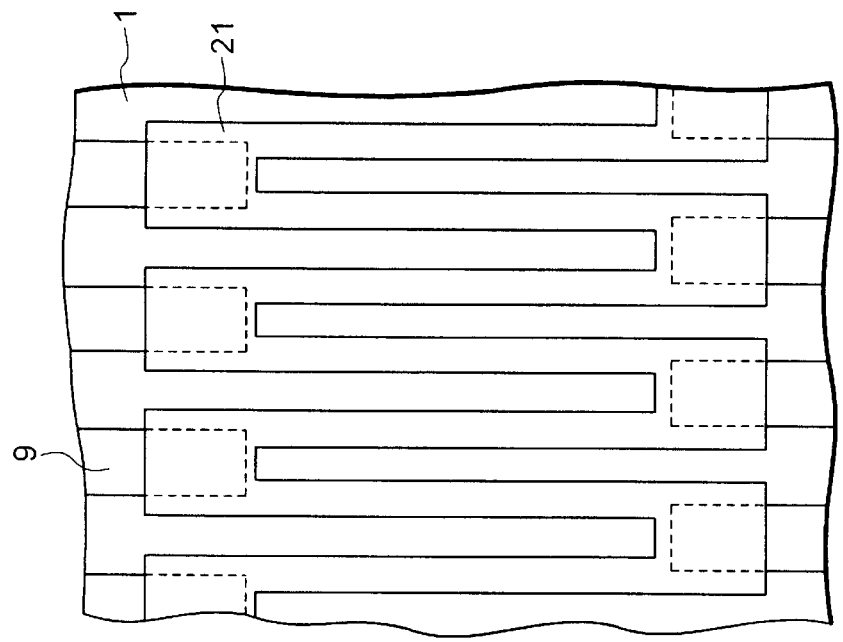
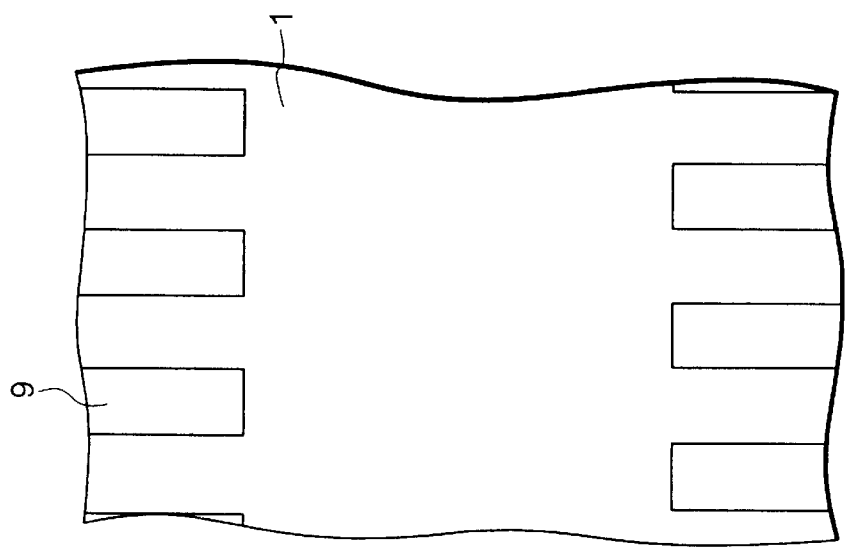

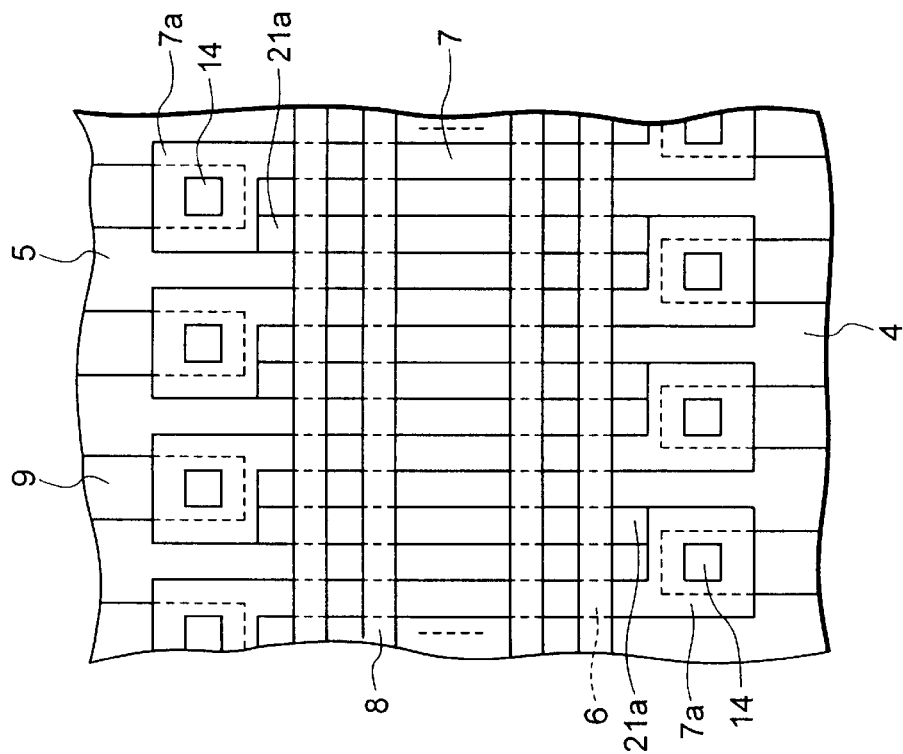
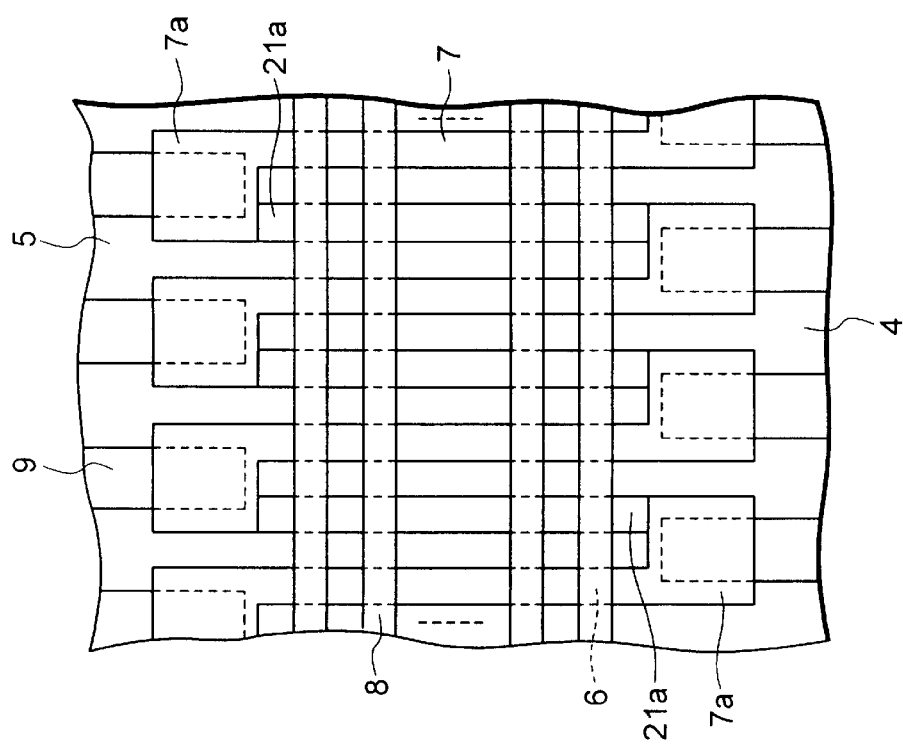

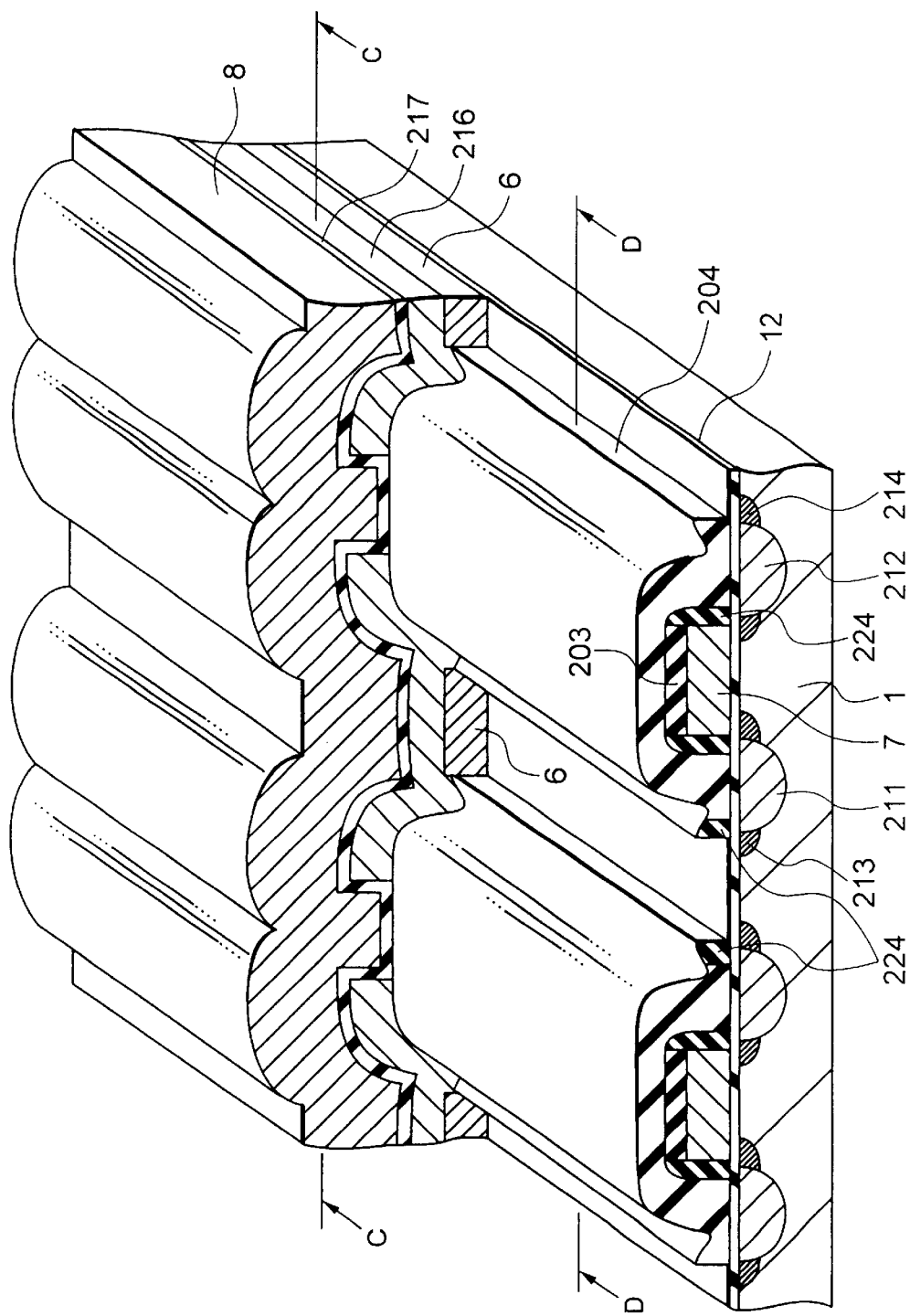

SEMICONDUCTOR MEMORY AND MANUFACTURING METHOD THEREOF

BACKGROUND OF THE INVENTION

1. Field of the Invention

The present invention relates to a semiconductor memory, which has a single transistor provided between embedded diffusion layers of two transistors in a memory cell so as to separate elements of the embedded diffusion layers, and a manufacturing method thereof. The present invention particularly relates to a semiconductor memory, which achieves the coexistence of the above element separation and insulating element separation, and a manufacturing method thereof.

2. Description of the Related Art

A semiconductor memory known as a representative semiconductor device is broadly divided into a volatile memory, in which stored information is erased when the power is turned off, and a nonvolatile memory, in which stored information is kept even when the power is turned off. The former is known as a random access memory (RAM) and the latter is known as a read only memory (ROM).

Of the above semiconductor memories, the ROM has been particularly adopted for a variety of information processing devices because of its nonvolatile characteristic. Above all, an EP (Erasable and Programmable) ROM and an EEP (Electrically Erasable and Programmable) ROM have been widely used. In the EPROM, written information can be erased by ultraviolet radiation and information can be electrically written again. In the EEPROM, information can be electrically erased and then written. A type of the EEPROM in which information can be erased at once and information can be written on a byte-by-bite basis has been known as a flash memory and has attracted attention as a replacement for a conventionally representative storage medium such as a floppy disk and a hard disk.

Each of these writable nonvolatile semiconductor memories has an MIS (Metal Insulator Semiconductor) structure. In this structure, a metal gate has a laminated structure having a floating gate embedded into an insulating film and a control gate being disposed above the floating gate via the insulating film. Electric charge is applied to the floating gate, which is electrically insulated from the surroundings, so as to store information. The accumulated electric charge is held in the floating gate even when the power is turned off, so that a nonvolatile function is achieved.

For example, Japanese Patent Laid-open Publication No. Hei. 6-283721 discloses the above-mentioned nonvolatile semiconductor memory, in which embedded diffusion layers are formed on semiconductor regions at both sides of a floating gate and the embedded diffusion layers are used as bit lines, and a manufacturing method thereof. FIG. 1 is a plan view showing the structure of a conventional nonvolatile semiconductor memory disclosed in Japanese Patent Laid-open Publication No. Hei. 6-283721. FIG. 2 is a sectional view taken along E—E line shown in FIG. 1.

As shown in FIGS. 1 and 2, in the conventional nonvolatile semiconductor memory, a first floating gate 54 and a second floating gate 55 are provided in parallel with each other via a gate oxide film 53 on a region such as an active region surrounded by element separating oxide films 52. The element separating oxide films 52 are formed at the surface of a P-type semiconductor substrate 51. N-type drain regions 56 and 57 are formed respectively between the element separating oxide films 52 and the first and second floating gates 54 and 55 at the surface of the semiconductor substrate 51. Further, an N-type source region 58 is formed between the first and second floating gates 54 and 55 at the surface of the semiconductor substrate 51. A first memory transistor is composed of the first floating gate 54, the drain region 56, and the source region 58, and a second memory transistor is composed of the second floating gate 55, the drain region 57, and the source region 58. Namely, the source region 58 is shared by the first and second memory transistors.

The first and second floating gates 54 and 55 are covered with an insulating film 60, which is composed of a laminated film so-called ONO (Oxide-Nitride-Oxide) including a silicon oxide film, a silicon nitride film, and a silicon oxide film. Control gates 61 are provided on the first and second floating gates 54 and 55 via the insulating film 60. Generally, polycrystalline silicon is used as the first and second floating gates 54 and 55 and the control gates 61.

As shown in FIG. 1, in the above construction of the nonvolatile semiconductor memory, the regions 56, 57, and 58 serve as embedded diffusion layers and extend to the adjacent memory cell as bit lines. Meanwhile, the control gates 61 extend along its length in a substantially perpendicular direction to the length of the regions 56, 57, and 58, and the control gates 61 are used as word lines.

Referring to FIGS. 3A to 3E, hereinafter a manufacturing method of the conventional nonvolatile semiconductor memory will be described in order of steps.

First, as shown in FIG. 3A, an oxidation resistance mask film 63 composed of a silicon nitride film is formed using the P-type semiconductor substrate 51 on a part serving as an active region, via a buffer film 62 composed of a silicon oxide film. Then, oxidation is performed by well-known LOCOS (Local Oxidation of Silicon) method so as to form the element separating oxide films 52 serving as field oxide films.

Next, after the buffer film 62 and the oxidation resistance mask film 63 are removed, as shown in FIG. 3B, normal oxidation is performed so as to form the gate oxide film 53 at the surface of the active region. Subsequently, with CVD (Chemical Vapor Deposition) method, a first conductive layer 64 made of polycrystalline silicon is entirely formed. Then, as shown in FIG. 3C, while resist films 65 cover regions on which the floating gates of the first conductive layer 64 are formed by photolithography method, the first conductive layer 64 is patterned so as to form the first floating gate 54 and the second floating gate 55, which are in parallel with each other. When the first and second floating gates 54 and 55 are formed by patterning the first conductive layer 64, mask alignment (position alignment) is performed in photolithography method. The mask alignment uses as a reference position the previously formed element separating oxide films 52 or a position alignment pattern, which is formed simultaneously with the above step.

Subsequently, an N-type impurity such as arsenic is ionically implanted into the active region by self-alignment using the resist films 65 and the first and second floating gates 54 and 55 as a mask. Afterwards, as shown in FIG. 3D, a heating operation is performed so as to form the N-type drain regions 56 and 57 and the source region 58. The regions 56, 57, and 58 are used as embedded diffusion layers. And then, oxidation is performed after the heating operation so as to increasingly oxidize the surfaces of the regions 56, 57, and 58, where N-type impurities are doped in a high concentration. Thus, an oxide film 66 is formed with a larger thickness than the gate oxide film 53. Therefore, the drain regions 56 and 57 and the source region 58 are embedded by the oxide film 66 and are used as embedded diffusion layers.

Next, as shown in FIG. 3E, with CVD method, the insulating film 60 composed of an ONO film is formed for covering the floating gates and covers the first and second floating gates 54 and 55. Afterwards, a second conductive layer 67 made of polycrystalline silicon is entirely formed thereon with CVD method, and the second conductive layer 67 is patterned so as to form the control gate 61, thereby completing the nonvolatile semiconductor memory shown in FIGS. 1 and 2.

Incidentally, in the manufacturing method of the conventional nonvolatile semiconductor memory disclosed in the above publication, when forming the floating gates by patterning the conductive layer, it is inevitable that displacement (misalignment) occurs relative to the element separating oxide film, which is a reference position of photolithography. Hence, the embedded diffusion layers, which are formed at both ends of the floating gate after this step, differ from each other in width on the right and left sides of the floating gate.

Namely, in the manufacturing method of the conventional nonvolatile semiconductor memory shown in FIGS. 3A to 3E, when the first conductive layer 64 is patterned so as to form the first and second floating gates 54 and 55, it is necessary to previously form the resist films 65 serving as masks on the first conductive layer 64. For this reason, a mask for forming a resist pattern is used with the element separating oxide film 52 and the like serving as a reference position to perform alignment on the semiconductor substrate 51.

However, in mask alignment, an exposing apparatus has a limit of mechanical accuracy of positioning, so that misalignment is inevitable. Therefore, especially in the recent lithography technique demanding fine patterning, accuracy of processing is seriously affected. For example, in the step illustrated in FIG. 3C, the resist films 65 are slightly shifted from predetermined positions to the right or left due to misalignment. Thus, the drain regions 56 and 57 and the source region 58, which are formed by self-alignment using the resist films 65 as a mask, differ from one another in width. Hereinafter, the drain regions 56 and 57 and the source region 58 will be collectively called embedded diffusion layers.

Hence, the embedded diffusion layers 56, 57, and 58, which serve as bit lines at both ends of the first and second floating gates 54 and 55, differ from one another in width. Uneven widths of the embedded diffusion layers result in uneven resistances thereof, so that a readout current of the nonvolatile semiconductor memory becomes irregular, causing a reading error. Particularly in the case of a nonvolatile semiconductor memory having a multilevel function of determining three or more kinds of current and reading current as data, slight irregularity of a readout current is likely to cause a reading error. Especially in finer patterning, a resistance value of an embedded diffusion layer is increased, so that a difference is reduced from an on-state resistance of a memory cell. Hence, reading determination with a sense amplifier is more difficult. For this reason, a margin has been conventionally provided for a width of the embedded diffusion layer in the design, in order to reduce a resistance value of the embedded diffusion layer to a certain value or less even when the embedded diffusion layers differ from one another in width in the manufacturing process. Consequently, it has been difficult to reduce the chip size.

The above misalignment also affects a nonvolatile semiconductor memory shown in FIG. 4, in which a single floating gate 68 is provided and embedded diffusion layers are provided at both ends thereof.

SUMMARY OF THE INVENTION

An object of the present invention is to provide a semiconductor memory and a manufacturing method thereof, by which it is possible to eliminate unevenness in width of the embedded diffusion layers respectively provided at both ends of a floating gate, the unevenness being resulted from misalignment.

According to one aspect of the present invention, a semiconductor memory comprises a memory cell region and a peripheral circuit region. The memory cell region includes semiconductor memory cells arranged in an array, and element separating shield electrodes which extend in a column direction and separate semiconductor memory cells being adjacent to each other in a row direction. The peripheral circuit region includes a peripheral circuit sending and receiving data to and from the semiconductor memory cell, and an element separation insulating film which separate elements in the peripheral circuit, the element separating shield electrodes extending onto the element separation insulating film at a boundary between the memory cell region and the peripheral circuit region.

According to the aspect of the present invention, element separation between the semiconductor memory cells is performed by the element separating shield electrodes, so that no misalignment occurs in the manufacturing process. Therefore, it is not necessary to provide a margin which has been conventionally required for misalignment on a diffusion layer. Hence, the memory cell region can be reduced. Additionally, the element separating shield electrodes extend onto the element separation insulating films at the boundary between the memory cell region and the peripheral circuit region. Thus, even when a contact hole reaching the element separating shield electrode is formed by plasma etching in the manufacturing process, it is possible to prevent plasma irradiation from causing dielectric breakdown on a thin insulating film, thereby securing high reliability.

According to another aspect of the present invention, a manufacturing method of the semiconductor memory comprises the steps of forming a gate conductive layer on a semiconductor substrate, and forming a source diffusion layer and a drain diffusion layer of the semiconductor memory cell by ion implantation into the semiconductor substrate using the gate conductive layer as a mask. All gate electrodes of the semiconductor memory cell and all of the element separating shield electrodes are integrated on the gate conductive layer.

According to the manufacturing method, the above misalignment can be eliminated, so that it is not necessary to provide a margin, which has been conventionally required for misalignment on the diffusion layer. Thus, the memory cell region can be reduced.

The manufacturing method preferably comprises the step of forming the element separation insulating film for the peripheral circuit, before forming the gate conductive layer. In element separation of the peripheral circuit, it is difficult to separate elements by the element separating shield electrodes. Hence, an ordinary method such as LOCOS method, recess LOCOS method, and trench insulating separation may be adopted, thereby readily manufacturing the element separating insulation film even in the case of a complex form.

Moreover, the shield electrodes may extend onto the element separation insulating films so as to eliminate a region having no element separation. Also, element separation can be readily switched just by overlapping. If the shield electrodes and the element separation insulating films are separated from each other, an electrically inseparable region exists between the cell region and the peripheral circuit region, so that some signals may cause a short.

Additionally, the step of forming the gate conductive layer is preferably a step of extending parts serving as the element separating shield electrodes of the gate conductive layer onto the element separation insulating film at a boundary between the memory cell region and the peripheral circuit region. In case that the element separating shield electrodes extend onto the element separation insulating film at the boundary between the memory cell region and the peripheral circuit region, when a contact hole reaching the element separating shield electrode is formed thereafter by plasma etching, it is possible to prevent plasma irradiation from causing dielectric breakdown on the thin insulating film, thereby securing high reliability.

Furthermore, the manufacturing method may further comprises the steps of, forming an interlayer insulating film at least in the memory cell region, forming a contact hole reaching the element separating shield electrode on a region where the element separating shield electrodes and the element separation insulating film overlap each other in the interlayer insulating film, embedding a conductive layer into the contact hole, and forming a metal layer on the interlayer insulating film, the metal layer being connected to a well on which the memory cells are formed, so that the conductive layer is connected to the well via the metal layer. In this case, a metal wire serving as a main source line can be adopted, so that it is not necessary to provide another region for a contact hole and the like. Therefore, it is preferable for saving an area.

BRIEF DESCRIPTION OF THE DRAWINGS

FIGS. 11A to 11D are layouts showing in order of steps a manufacturing method of the nonvolatile semiconductor memory according to the embodiment of the present invention.

FIG. 12 is a perspective view showing the completed nonvolatile semiconductor memory.

DETAILED DESCRIPTION OF THE PREFERRED EMBODIMENT

After the inventors of the present application earnestly conducted studies and experiments to solve the aforementioned problems, they found that in a nonvolatile semiconductor memory, element separation is possible between embedded diffusion layers while preventing misalignment, by providing a shield electrode between the embedded diffusion layers of a transistor making up a memory cell, and keeping the shield electrode at a ground potential or a source potential of the transistor.

However, only with an element separating method for a memory cell region including a plurality of memory cells, it is not possible to make clear an element separating method for a peripheral circuit region around the memory cell region or the relationship between these element separating methods. Thus, the implementation is difficult.

Therefore, the inventors of the present application further studied the element separating method for a peripheral circuit region and the relationship between the element separating methods as well as the element separating method for a memory cell region. As a result, they devised the present invention.

Figure 5:
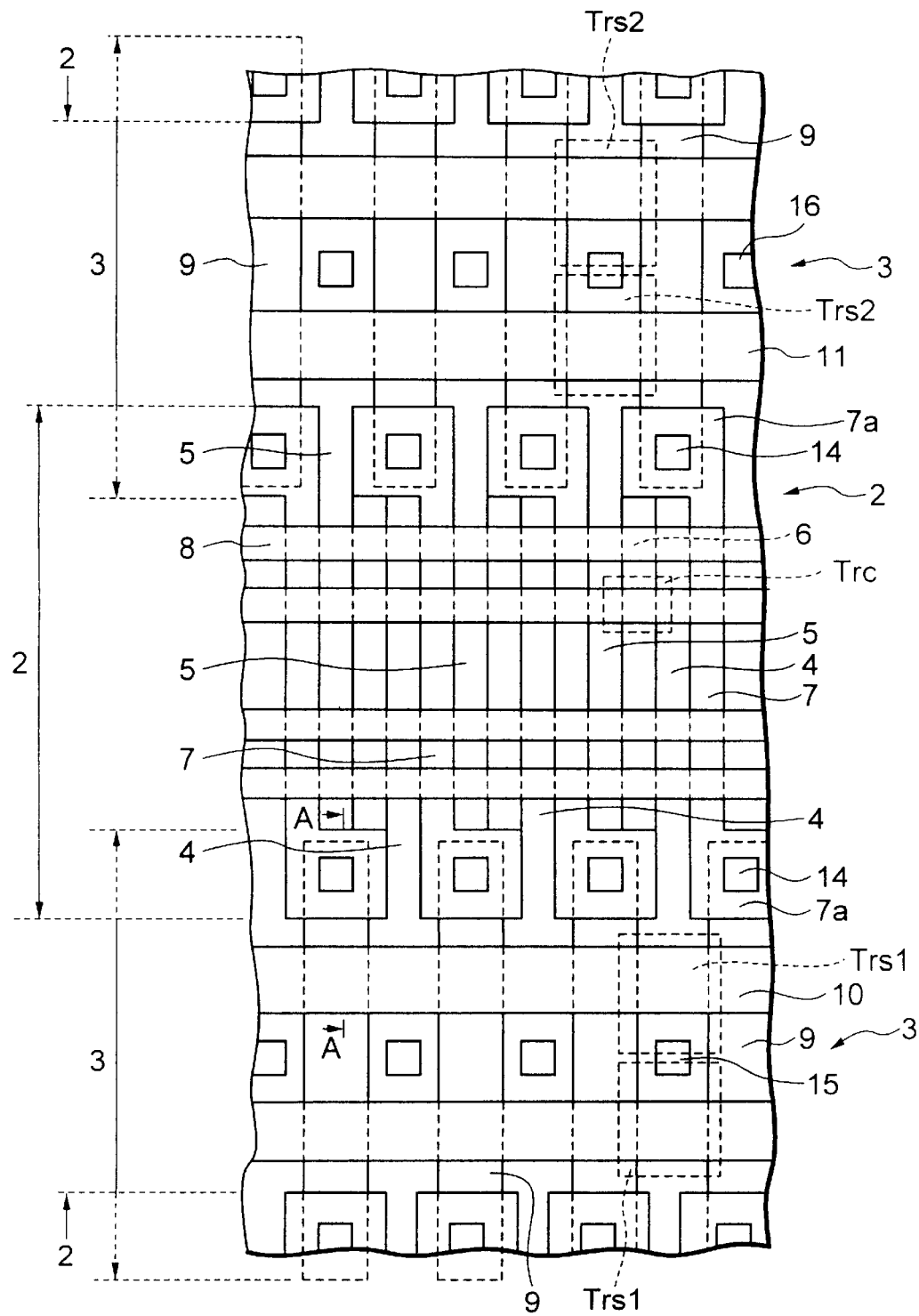
FIG. 5 is a layout showing a nonvolatile semiconductor memory according to an embodiment of the present invention, in which first and second metal wire layers are omitted.
Figure 6:
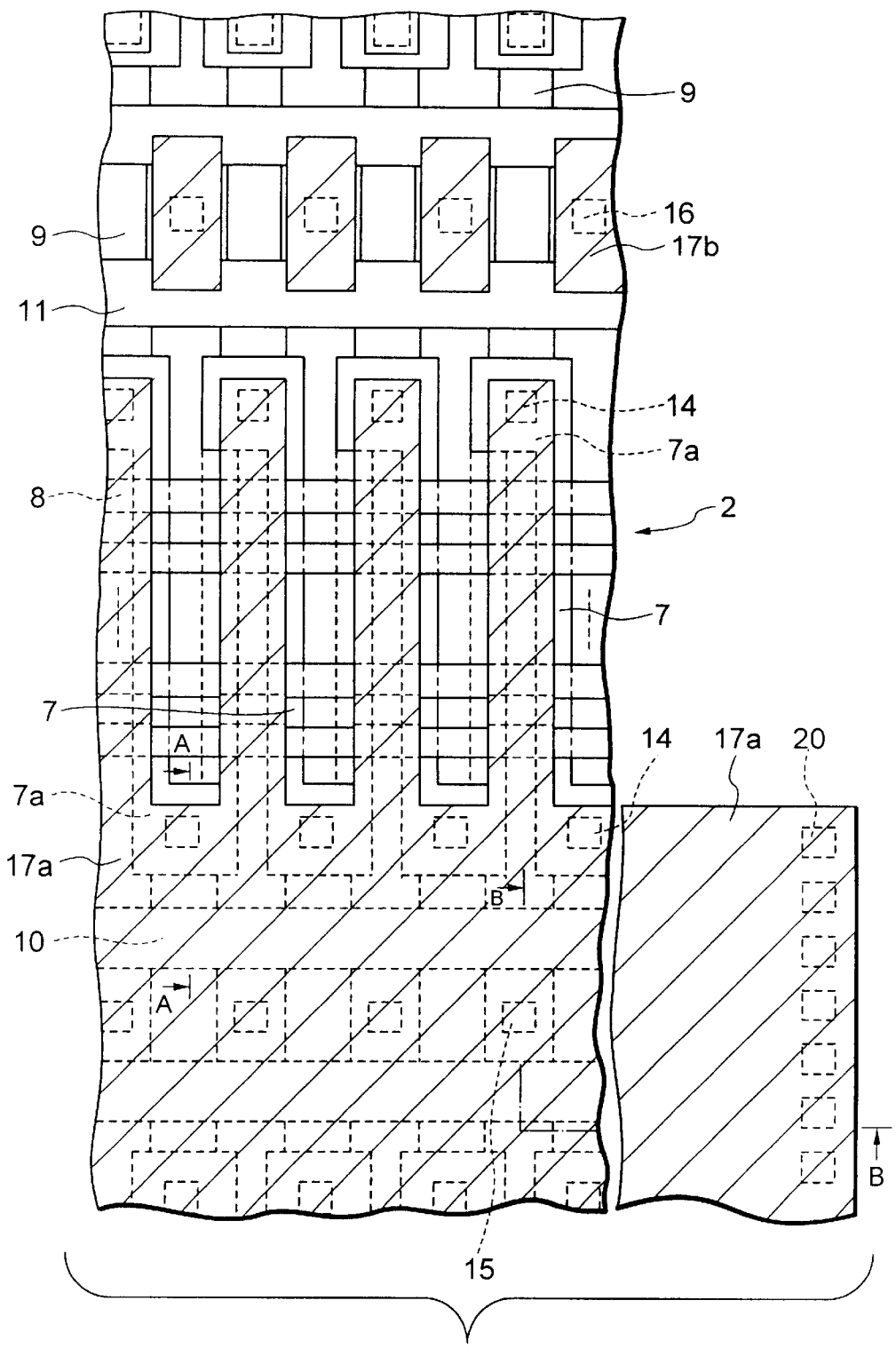
FIG. 6 is a layout showing the nonvolatile semiconductor memory including the first metal wire layer according to the embodiment of the present invention, in which the second metal wire layer is omitted.
Figure 7:
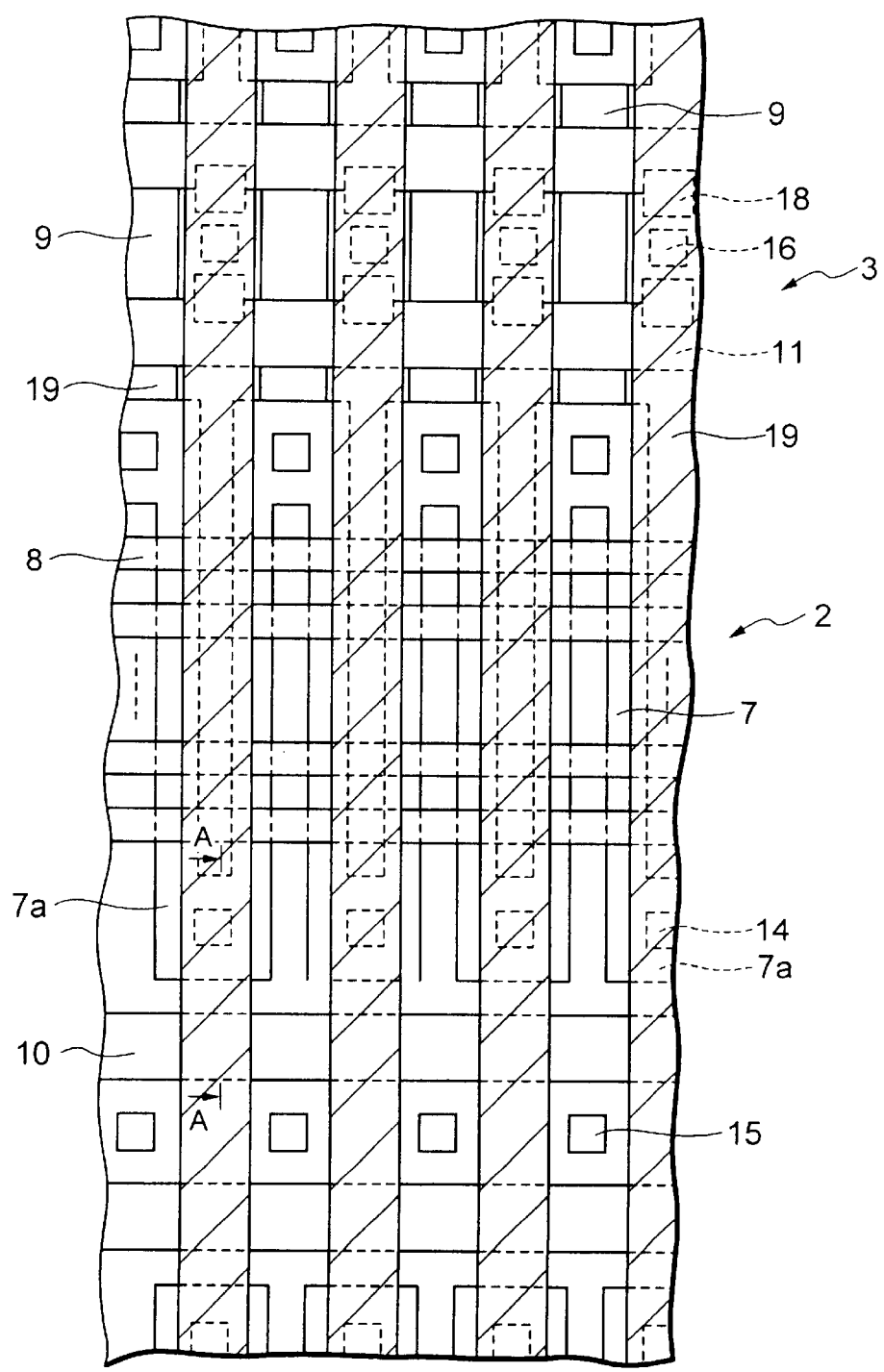
FIG. 7 is a layout showing the nonvolatile semiconductor memory including the second metal wire layer according to the embodiment of the present invention, in which the first metal wire layer is omitted.
Figure 8:
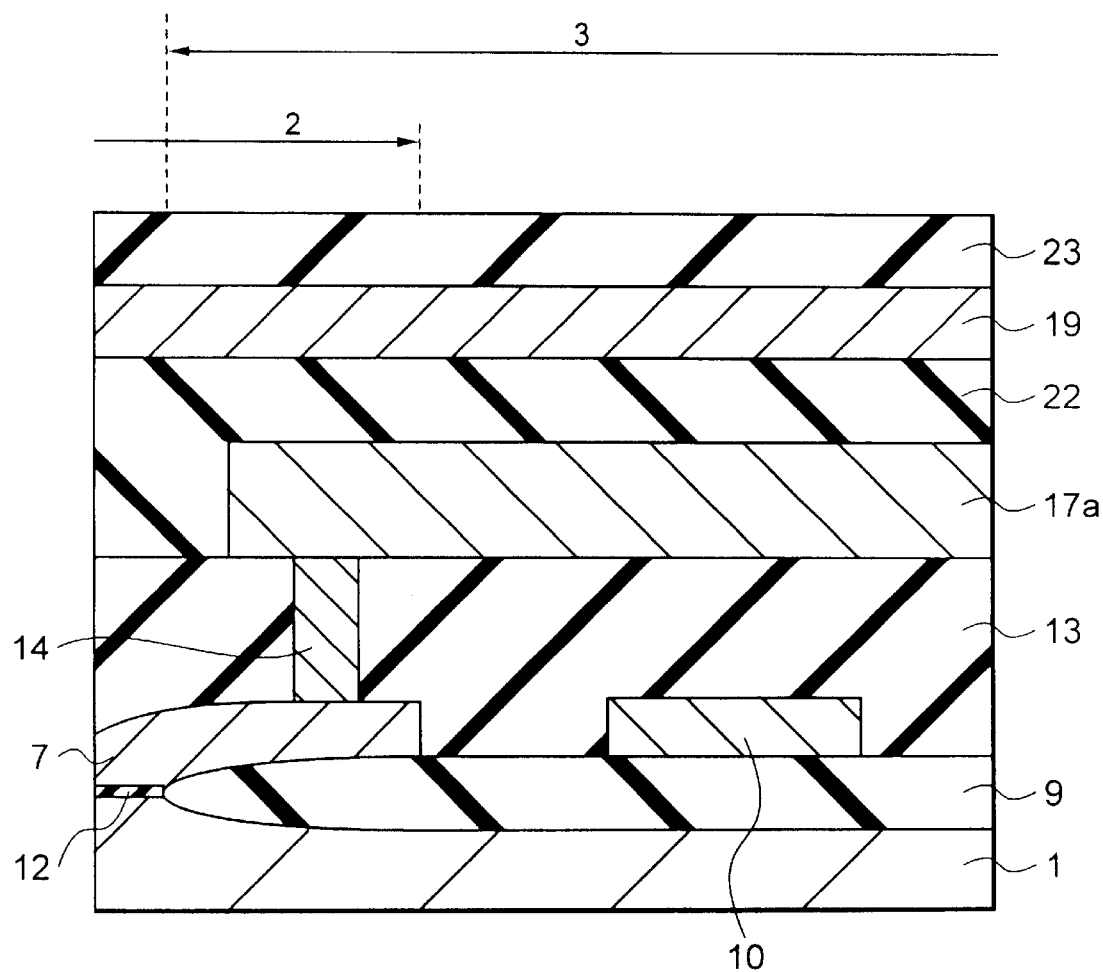
FIG. 8 is a sectional view taken along A—A line shown in FIGS. 5 to 7.
Figure 9:
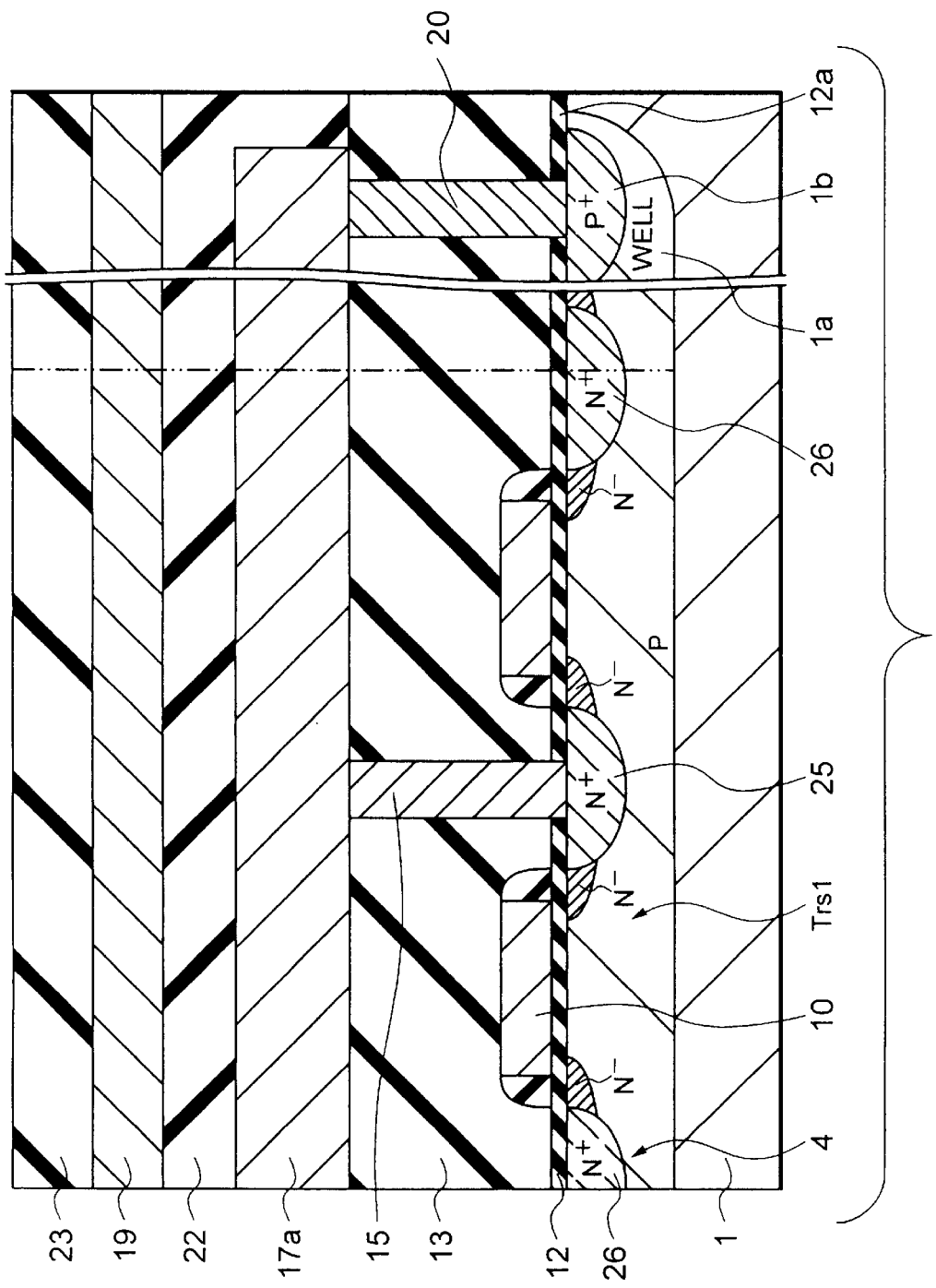
FIG. 9 is a sectional view taken along B—B line shown in FIG. 6.
Figure 10:
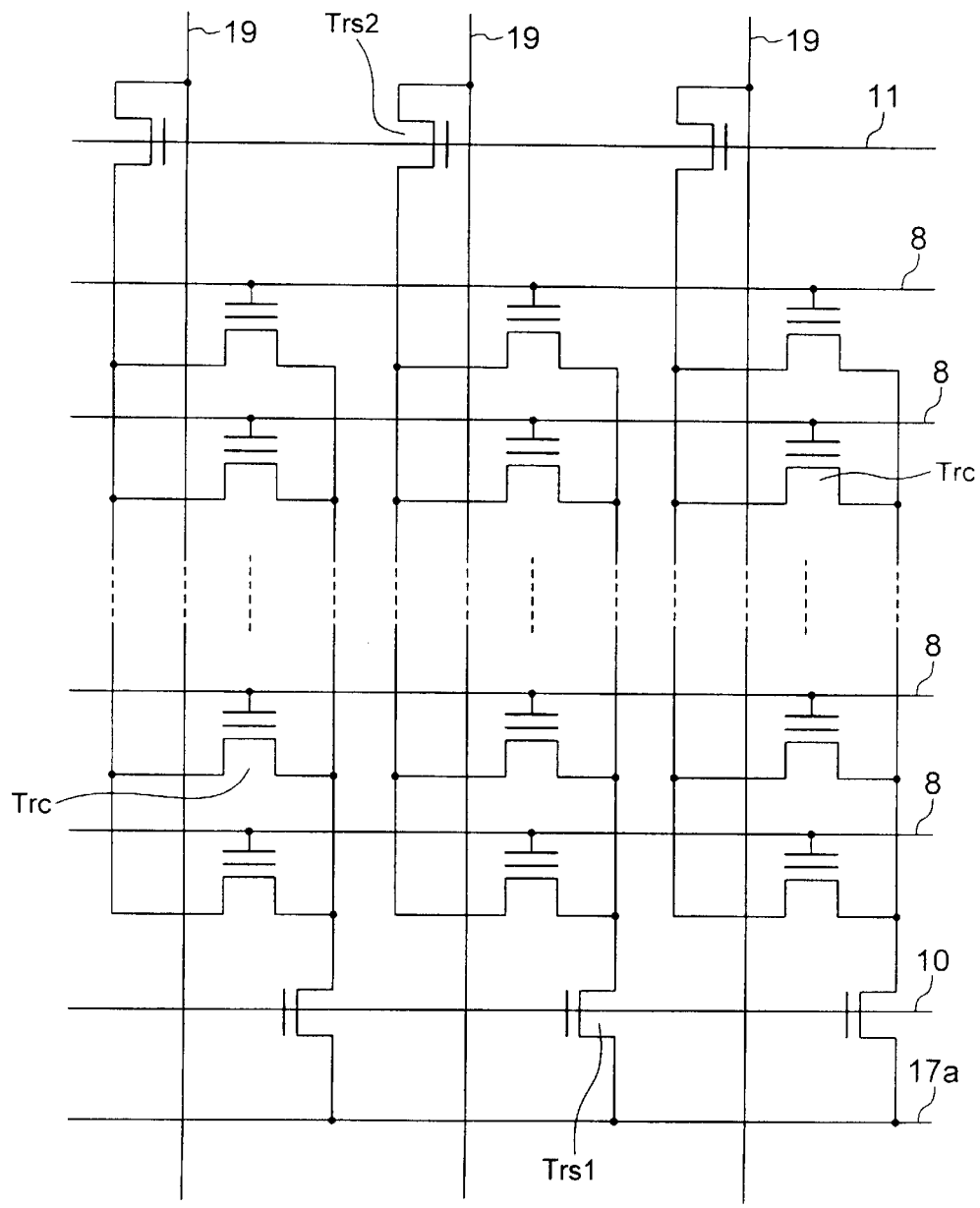
FIG. 10 is a circuit diagram showing the nonvolatile semiconductor memory according to the embodiment of the present invention.

Hereinafter preferred embodiments according to the present invention will be described specifically referring to the accompanying drawings. FIG. 5 is a layout showing a nonvolatile semiconductor memory according to the embodiment of the present invention, in which first and second metal wire layers are omitted. FIG. 6 is a layout showing a nonvolatile semiconductor memory including the first metal wire layer according to the embodiment of the present invention, in which the second metal wire layer is omitted. FIG. 7 is a layout showing a nonvolatile semiconductor memory including the second wire layer according to the embodiment of the present invention, in which the first metal wire layer is omitted. Further, FIG. 8 is a sectional view taken along A—A line shown in FIGS. 5 to 7. FIG. 9 is a sectional view taken along B—B line shown in FIG. 6. FIG. 10 is a circuit diagram showing a nonvolatile semiconductor memory according to the embodiment of the present invention.

The present embodiment includes memory cell regions 2, each having a plurality of memory cells, and peripheral circuit regions 3, each having a logical circuit for writing and reading data of the memory cells. The memory cell regions 2 and the peripheral circuit regions 3 overlap one another at the boundaries thereof.

As shown in FIG. 5, in the present embodiment, the memory cell region 2 spreads from the upper ends to the lower ends of the element separating shield electrodes 7, and the peripheral circuit region 3 spreads from the upper ends to the lower ends of element separation insulating films 9. The element separating shield electrodes 7 and the element separation insulating films 9 overlap each other in a region where the memory cell regions 2 and the peripheral circuit regions 3 overlap each other.

Cell transistors Trc, which make up each of the plural memory cells in an array, are arranged in the memory cell region 2. One of the cell transistors Trc is surrounded by a broken line in FIG. 5. Source diffusion layers 4 of the cell transistors Trc are formed on the right side of the floating gates 6 in FIGS. 5 to 7, and drain diffusion layers 5 are formed on the left side of the floating gates 6 in FIGS. 5 to 7. Moreover, the source diffusion layers 4 and the drain diffusion layers 5 are connected in common between a plurality of the cell transistors Trc arranged in a column. Here, the source diffusion layer 4 and the drain diffusion layer 5 may have an LDD structure and have a conductivity type such as N-type, for example.

Also, in the memory cell region 2, the element separating shield electrodes 7 are formed in a plurality of columns so as to separate elements between the diffusion layers 4 and 5 which are adjacent to each other in a row direction. The element separating shield electrodes 7 extend in a column direction. At the both ends thereof, wide parts 7a are formed so as to extend to the ends of a plurality of the cell transistors Trc, which are adjacent to one another in rows, and the wide parts 7a extend in width at the ends of the cell transistors Trc.

Furthermore, in the memory cell region 2, control gates 8 re formed in a plurality of rows. The control gates 8 extend in a row direction and are shared by the cell transistors Trc which are adjacent to each other in a row direction.

Meanwhile, in the peripheral circuit region 3, the peripheral element separation insulating films 9 are formed, which are made of a silicon oxide film or the like and extend outward from below the wide parts 7a of the element separating shield electrodes 7, at a surface of a P-type semiconductor substrate 1 or a P-type well 1a (hereinafter, collectively referred to as a semiconductor substrate 1), which is formed at a surface of the semiconductor substrate. As shown in FIG. 8, in this region, the memory cell region 2 and the peripheral circuit region 3 overlap each other. Hereinafter, the P-type semiconductor substrate 1 or the P-type well 1a is used as an example. However, an N-type semiconductor substrate or an N-type well may be used in the same manner by reversing the following conductivity type.

Additionally, as shown in FIG. 9, the peripheral circuit region 3 is provided with a plurality of first select transistors Trs1, each having an LDD structure and being connected to the source diffusion layers 4 of the cell transistors Trc. The diffusion layers of the first select transistors Trs1, which are adjacent to each other in a row direction, are subjected to element separation by the peripheral element separating insulation films 9. Moreover, first selection gate electrodes 10, which extend in a row direction as common gate electrodes of the first select transistors Trs 1, are formed on the semiconductor substrate 1 via a peripheral gate insulating film 12a composed of a silicon oxide film or the like. In the same manner, a plurality of second select transistors Trs2, each having an LDD structure and being connected to the drain diffusion layers 5 of the cell transistors Trc are provided. The diffusion layers of the second select transistors Trs2, which are adjacent to each other in a row direction, are subjected to element separation by the peripheral element separation insulating films 9. Further, second selection gate electrodes 11, which extend in a row direction as common gate electrodes of the second select transistors Trs2, are formed on the semiconductor substrate 1 via the peripheral gate insulating film 12a. The peripheral gate insulating film 12a is formed in a different step from the gate insulating film 12 of the memory cell region 2 and is larger in thickness than the gate insulating film 12. Additionally, the peripheral gate insulating film 12a may be formed in the same manner as the gate insulating film 12.

Also, a first interlayer insulating film 13 composed of a silicon oxide film, for example, is entirely formed on the memory cell region 2 and the peripheral circuit region 3. As shown in FIG. 8, a contact hole reaching the wide part 7a is formed in the first interlayer insulating film 13, an a conductive layer 14 (connecting conductive layer) made of a material such as W, for example, is embedded into the contract hole. Further, as shown in FIG. 9, drains 26 of the first select transistors Trs1 are connected to the source diffusion layers 4 (substrate source line). Sources 25 of the first select transistors Trs1 are connected to a first metal wire layer 17a (main source line). The gates of the first select transistors Trs1 are connected to the first selection gate electrodes 10 (first selection signal line). The sources of the second select transistors Trs2 are connected to the drain diffusion layers 5 (substrate bit line). The drains of the second select transistors Trs2 are connected to the second metal wire layers 19 (main bit line). The gates of the second select transistors Trs2 are connected to the second selection gate electrodes 11 (second selection signal line).

As shown in FIG. 9, a contact hole reaching the source 25 of the first select transistor Trs1 is formed in the first interlayer insulating film 13, and the conductive layer 15 (connecting conductive layer) made of a material such as W, for example, is embedded into the contact hole. In the same manner, a contact hole reaching the drain of the second select transistor Trs2 is formed in the first interlayer insulating film 13, and a conductive layer 16 is embedded into the contact hole. Then, as shown in FIG. 6, the first metal wire layers 17a and 17b made of a material such as Al and Cu, for example, are formed on the first interlayer insulating film 13. The first metal wire layer 17a is connected to the conductive layers 14 which are connected to the wide parts 7a, and the conductive layers 15 which are connected to the diffusion layers on the side of the source diffusion layers 4. Meanwhile, the first metal wire layers 17b are provided respectively on the conductive layers 16 which are connected to the diffusion layer (sub bit line) on the side of the drain diffusion layer 5. Each of the first metal wire layers 17b is connection to the diffusion layer individually. The first metal wire layer 17a acts as a main source line of the memory cell array and is connected to the well 1a or the semiconductor substrate 1, on which the cell transistors Trc are formed, via a contact 20 and a P+ diffusion layer 1b.

Moreover, a second interlayer insulating film 22 composed of a BPSG film, for example, is formed on the first interlayer insulating film 13 so as to cover the first metal wire layers 17a and 17b. Two through holes reaching the first metal wire layer 17b are formed in the second interlayer insulating film 22, and a conductive layer 18 is embedded into the through holes. Then, as shown in FIG. 7, the second metal wire layers 19 which are connected to the conductive layer 18 and are made of a material such as Al and Cu, for example, is formed on the second interlayer insulating film 22. Each of the second metal wire layers 19 serves as a main bit line of the memory cell array. A cover film 23 is formed on the second metal wire layers 19 and the second interlayer insulating film 22.

Figure 13:
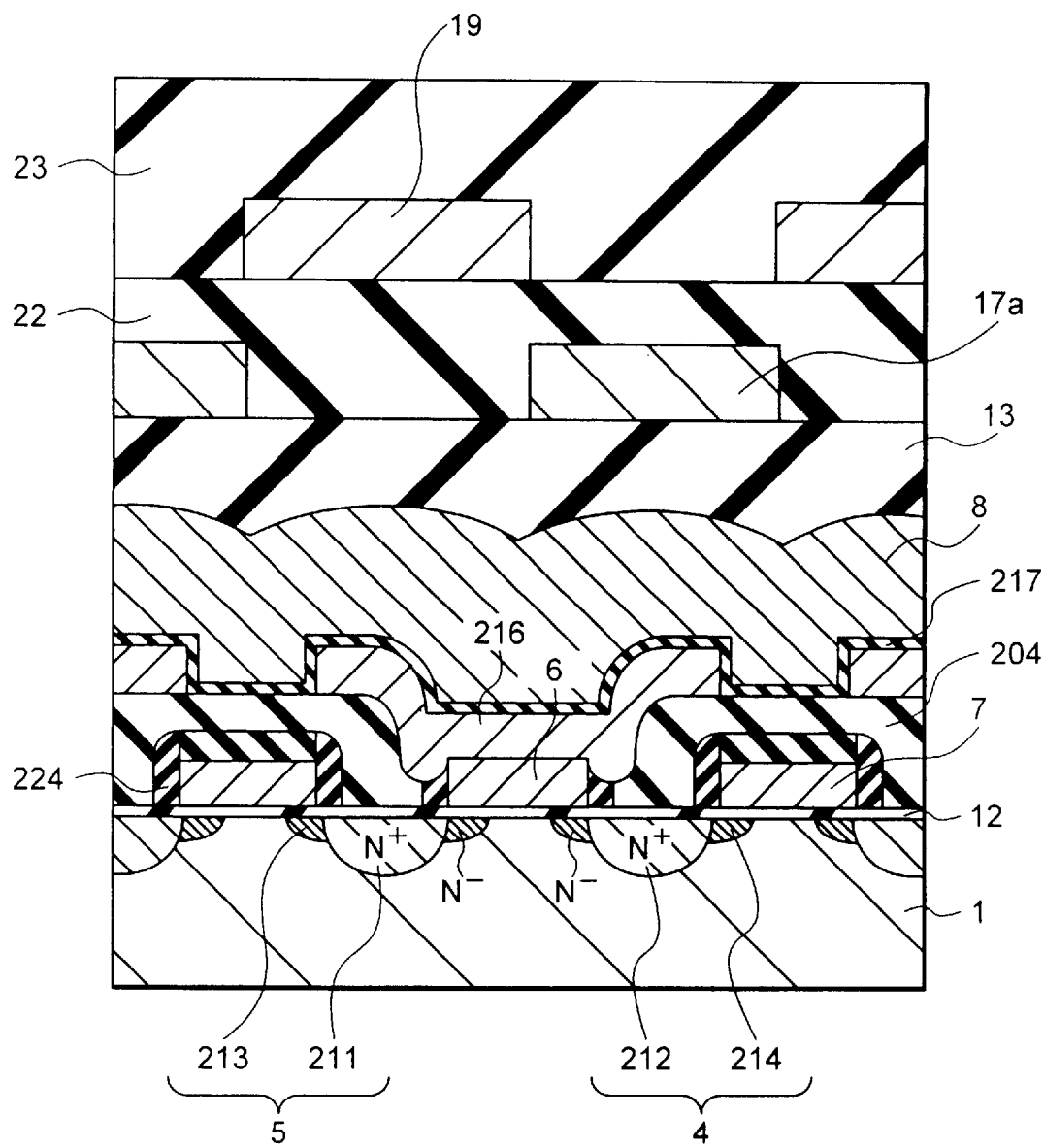
FIG. 13 is a sectional view taken along C—C line shown in FIG. 12.
Figure 14:
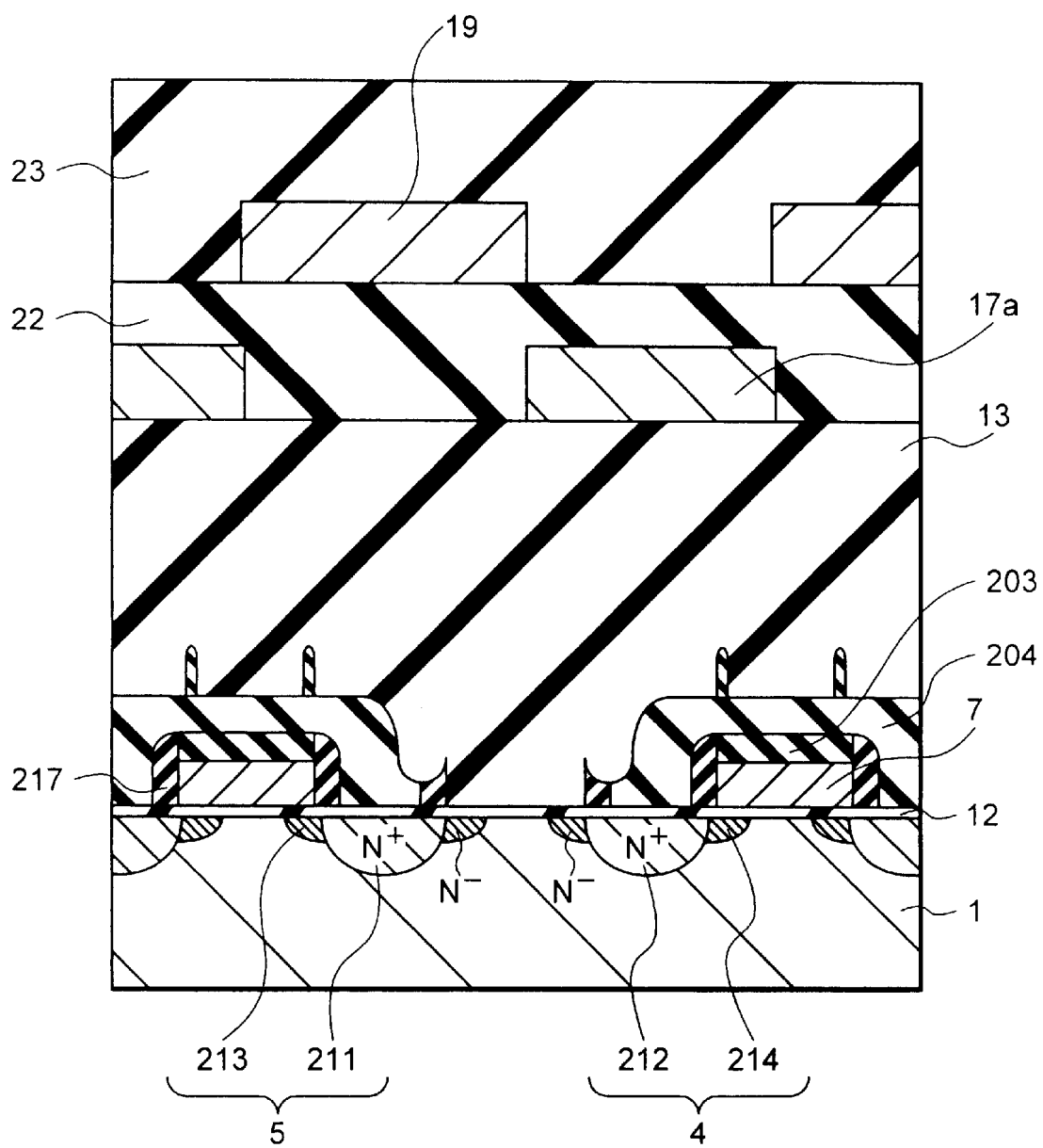
FIG. 14 is a sectional view taken along D—D line shown in FIG. 12.

Next, a manufacturing method of the nonvolatile semiconductor memory of the above embodiment will be described. FIGS. 11A to 11D are layouts showing in order of steps the manufacturing method of the nonvolatile semiconductor memory according to the embodiment of the present invention. FIG. 12 is a perspective view showing the completed nonvolatile semiconductor memory. FIG. 13 is a sectional view taken along C—C line shown in FIG. 12. FIG. 14 is a sectional view taken along D—D line shown in FIG. 12.

Figure 1:
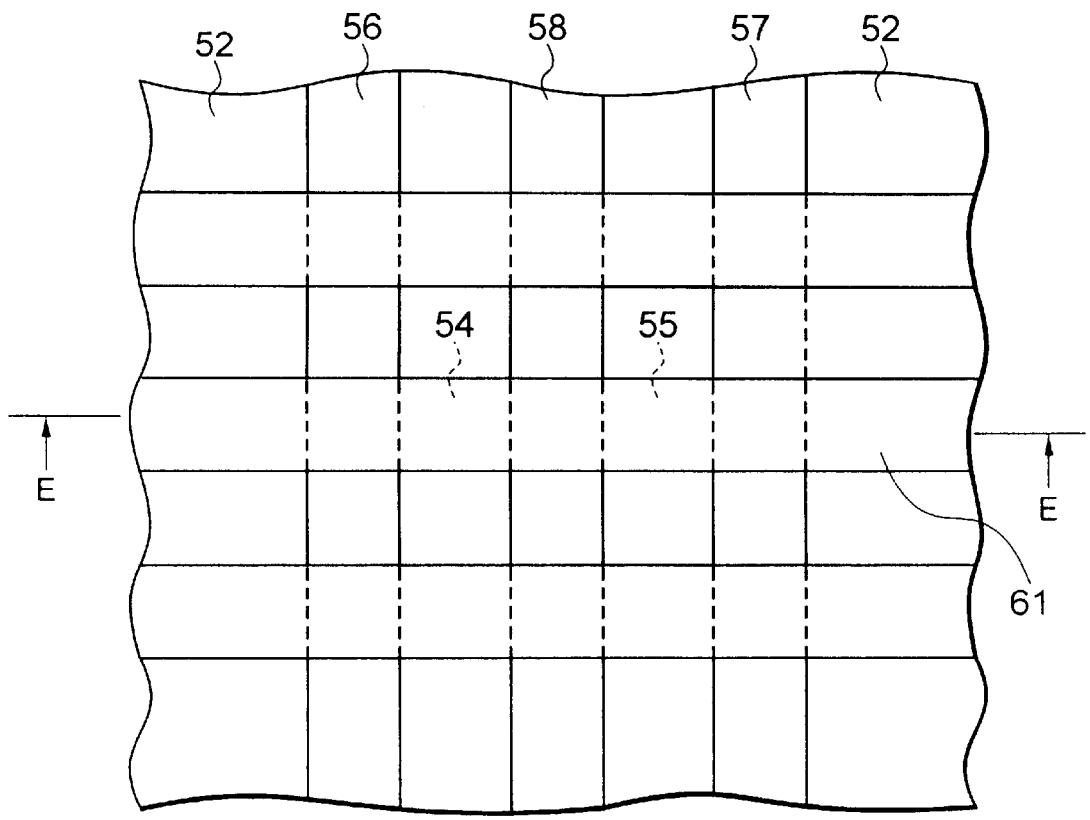
FIG. 1 is a plan view showing the structure of a conventional nonvolatile semiconductor memory disclosed in Japanese Patent Laid-open Publication No. Hei. 6-283721.
Figure 2:
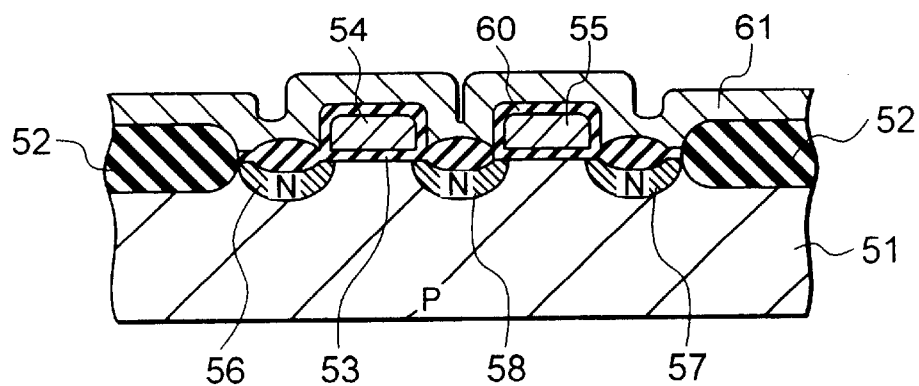
FIG. 2 is a sectional view taken along E—E line shown in FIG. 1.
Figure 3A:
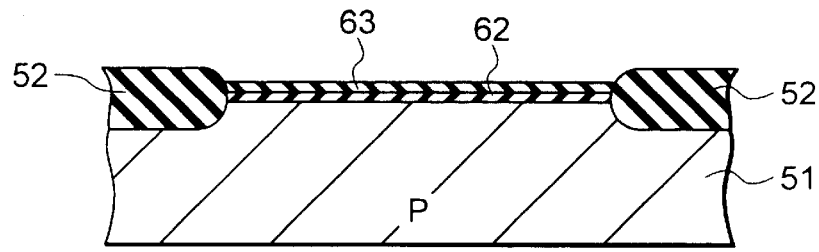
FIGS. 3A to 3E are sectional views showing a manufacturing method of the conventional nonvolatile semiconductor memory in order of steps.
Figure 3B:
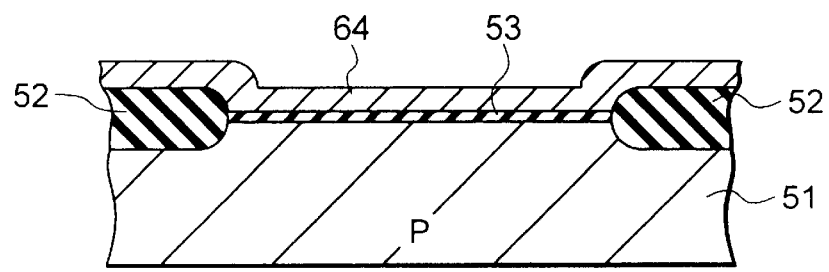
Figure 3C:
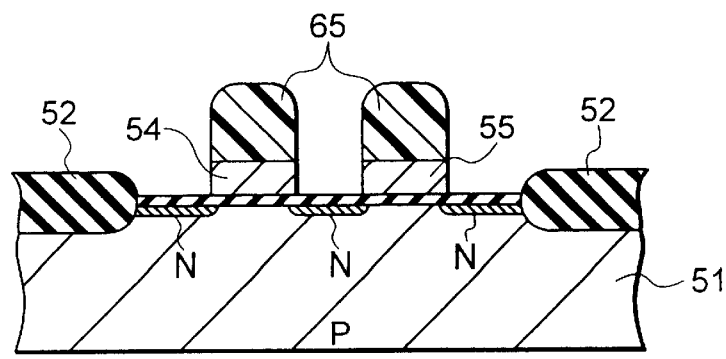
Figure 3D:
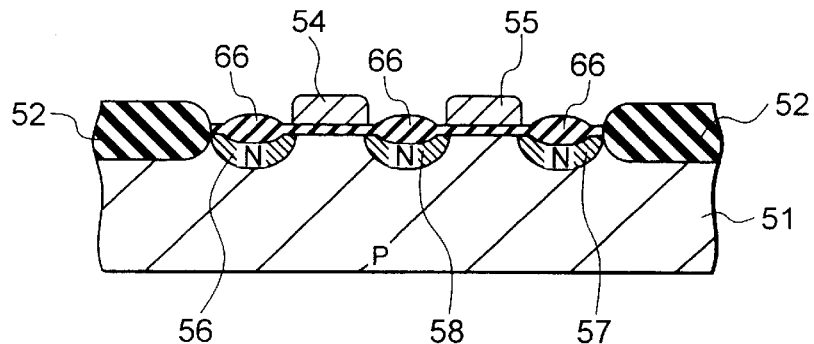
Figure 3E:
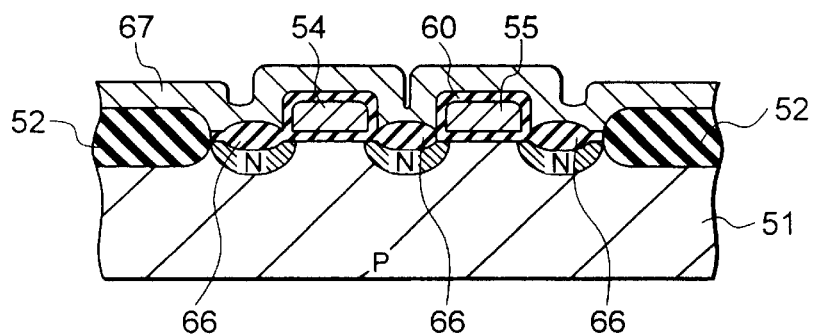
Figure 4:
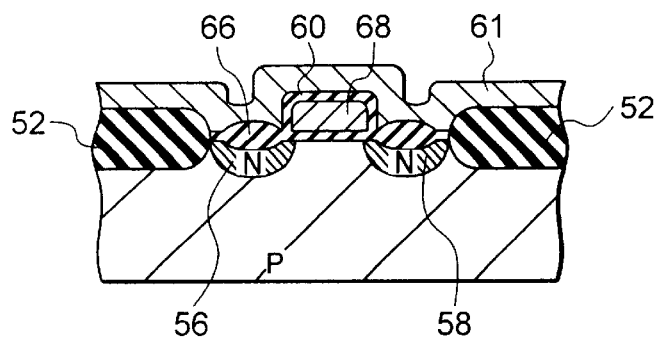
FIG. 4 is a sectional view showing the structure of a conventional nonvolatile semiconductor memory including a single floating gate.

First, as shown in FIG. 1A, the peripheral element separation insulating films 9 for a select transistor and the like are formed on the P-type semiconductor substrate 1 by a method such as LOCOS method, recess LOCOS method, and trench insulating separation (STI: Shallow Trench Isolation).

Subsequently, a thin insulating film (not shown) serving as a gate insulating film 12 is entirely formed thereon. Then, as shown in FIG. 11B, wavy gate conductive layers 21, which are made of a material such as polycrystalline silicon, for example and make a turn by 180° on the peripheral element separation insulating films 9, and on-the-gate insulating films 203 thereon are formed on the semiconductor substrate 1 by the well-known technique of patterning. At this time, these films are left unpatterned in the peripheral circuit region 3. Although the gate conductive layer 21 will serve as the floating gates 6 and the element separating shield electrodes 7 in the following step, as described above, these electrodes are integrally formed so as to be continuously connected in this step of the present embodiment. Further, the 180-degree-reversed parts of the gate conductive layer 21 will serve as the wide parts 7a.

Namely, a thin insulating film serving as the gate insulating film 12 (shown in FIGS. 12 to 14) is entirely formed thereon. After then, the gate conductive layer 21 made of a material such as polycrystalline silicon, for example, and the on-the-gate insulating film 203 composed of a silicon oxide film, for example, are formed on the semiconductor substrate 1. Subsequently, with the well-known lithography technique, as shown in FIG. 11B, the films 12, 21, and 203 are patterned into wavy shapes so as to make a turn by 180° at each end of the element separation insulating films 9. The films 12, 21, and 203 are left unpatterned in the peripheral circuit region 3. Although the gate conductive layer 21 will serve as the floating gates 6 and the element separating shield electrodes 7 in the following step, as described above, these electrodes are integrally formed so as to be continuously connected in this step. Moreover, the 180-degree-reversed parts of the gate conductive layer 21 will serve as the wide parts 7a.

Afterwards, the memory cell region 2 is subjected to ion implantation with an N-type impurity by using the gate conductive layer 21 and the on-the-gate insulating film 203 as a mask which have remained on the memory cell region 2. Thus, diffusion layers 213 and 214 (shown in FIGS. 12 to 14) are formed with a low impurity concentration. Moreover, an insulation film composed of an oxide film, for example, is formed on the memory cell region 2 and is etched back so as to form side walls 224 (shown in FIGS. 12 to 14) on the side of the gate conductive layer 21. Then, the memory cell region 2 is subjected to ion implantation with a higher concentration than the first ion implantation, by using the element separating shield electrodes 7 and the side walls 224 as a mask. Thus, diffusion layers 211 and 212 (shown in FIGS. 12 to 14) are formed with a high concentration and the diffusion layers 4 and 5 are formed with an LDD structure.

Next, CVD insulating films 204 (shown in FIGS. 12 to 14) composed of an oxide film, for example, are deposited by CVD method entirely on a wafer, where the gate conductive layer 21 is formed, and the CVD insulating film 204 is removed by plasma etching on parts serving as the floating gates 6. With this arrangement, a thick insulating film remains on the element separating shield electrodes 7 and parts serving as the floating gates 6 are exposed for each column. As a result, it is possible to increase a capacitance between the floating gates 6 and the control gates 8 and to improve voltage resistance between the element separating shield electrodes 7 and the control gates 8.

At this moment, some steep points exit on the CVD insulating film 204. Hence, another CVD insulating film is formed and is etched back so as to smooth out the corners of the CVD insulating film.

Subsequently, a gate conductive layer 216 (shown in FIGS. 12 to 14) made of a material such as polycrystalline silicon, for example, is further formed on the parts where the floating gates 6 are exposed as lower layers. Further, patterning is performed such that the control gates 8 are overlapping the floating gates 6 in a larger area than a channel. Hereinafter, a gate of a double-layer structure, which has the gate conductive layer 21 as a lower layer and the gate conductive layer 216 as an upper layer, is referred to as the floating gates 6. As described above, the upper surface is larger in area than the lower surface so as to reduce a voltage required for writing and erasing.

Subsequently, an ONO film 217 (shown in FIGS. 12 to 14) is formed entirely on the wafer so as to cover the exposed upper surfaces of the floating gates 6, a gate conductive layer (not shown) made of a material such as polycrystalline silicon, for example, is formed with CVD method, a refractory metal film (not shown) made of a material such as W, Ti, and Co, for example, is formed with a sputtering method or CVD method, and a heat treatment is performed. Thus, a silicide film (8) (shown in FIGS. 12 to 14) made of a material such as tungsten silicide, for example, is formed.

Then, as shown in FIG. 12, with the well-known lithography technique, a photoresist pattern is formed on the silicide film and the control gate 8 is formed so as to extend in a row direction. Specifically, a photoresist pattern is formed on the control gates 8 and the peripheral circuit region 3 including the wide parts 7a, the silicide film (8) and the ONO film 217 are removed in this order by using the photoresist pattern as a mask. Further, an exposed part of the double-layer structure, which has the gate conductive layers 21 and 216, is removed. In this step, the floating gates 6 are formed to be separated from each other. At this time, regarding parts covered with the thick CVD insulating film 204 on the gate conductive layer 21, an etching selection ratio is quite large between the oxide film and the polycrystalline silicon film, so that the covered parts remain as the element separating shield electrodes 7. Also, at this time, connecting parts 21a (FIG. 11C) between the floating gates 6 and the element separating shield electrodes 7 are simultaneously removed in the gate conductive layer 21 so as to separate the floating gates 6 and the element separating shield electrodes 7.

Therefore, when ion implantation is performed to form the diffusion layers 4 and 5 (step shown in FIG. 11B), the gate conductive layer 21 exist with the connecting parts 21a, so that the diffusion layers 4 and 5 can be formed without electrical connection. Additionally, in the step of separately forming the floating gates 6 after ion implantation, the connecting parts 21a are removed by etching and the floating gates 6 and the element separating shield electrodes 7 are separated from each other. Hence, separation is possible without additional steps.

Subsequently, after forming the transistors Trs1 and Trs2 and other elements in the peripheral circuit region 3 and not shown peripheral circuit region, the first interlayer oxide film (first interlayer insulating film 13 shown in FIGS. 8 and 9) is entirely formed. As shown in FIG. 1D, a contact hole reaching the wide part 7a is formed in the first interlayer oxide film. Here, the contact hole is formed on a position where the wide part 7a overlaps the peripheral element separation insulating film 9. Further, the conductive layer 14 made of a material such as W, for example, is embedded into the contact hole.

Afterwards, the first metal wire layer (first metal wire layers 17a and 17b shown in FIG. 6), which serves as a main source line for determining a source potential of the cell transistor Trc, is formed on the first interlayer oxide film, so that the conductive layer 14 and the well 1 of the cell transistor Trc are connected to each other. Then, with an ordinary method, the second metal wire layers 19 such as a main bit line are formed so as to complete the nonvolatile semiconductor memory.

According to such a manufacturing method, the gate conductive layer 21, which will serve as the floating gates 6 and the element separating shield electrodes 7 later, is integrally formed by using the same mask and is used as a mask for forming the cell transistors Trc having an LDD structure. Hence, it is possible to prevent misalignment in separating elements between transistors adjacent to each other in a row direction. Namely, conventionally, after forming the element separating oxide film with LOCOS method or STI, the gate electrode is formed relative to the element separating oxide film, so that in the event of displacement of the gate electrode, the source diffusion layer and the drain diffusion layer, which are formed on the both ends of the gate electrode, may differ from each other in width. However, the present embodiment makes it possible to prevent such an uneven width between diffusion layers.

Therefore, it is not necessary to provide a margin for misalignment on the source diffusion layer 4 and the drain diffusion layer 5 in the design, so that the memory cell region 2 can be reduced. Moreover, upon manufacturing the peripheral circuit region 3, in which it is difficult to separate elements by the element separating shield electrodes 7, the peripheral element separation insulating film 9 is formed with LOCOS method, recessed LOCOS method, or STI. Hence, the peripheral circuit region 3 can be readily formed by an ordinary method.

Also, the element separating shield electrodes 7 and the embedded diffusion layers 4 and 5 may constitute a MOS transistor, and the element separating shield electrode 7 is equal to the well 1a in potential, so that insulating separation is possible between the embedded diffusion layers 4 and 5. It is preferable to adopt an enhancement-type transistor as the transistor including the element separating shield electrodes 7, and it is preferable that a bias voltage, which is applied to the element separating shield electrodes 7, be equal to the well 1a in potential. However, a potential is not limited to the above potential as long as, the bias voltage is set to prevent current from passing through a channel region of the MOS transistor.

Additionally, if the electrical connection is made with the wire layer, which has a ground potential close to that of the connecting conductive layer 14, on the metal wire layer, it is not necessary to form a well contact part specifically for the element separating shield electrodes 7. In the present embodiment, the main source lines (first metal wire layer 17a), which are equal to the well in potential, and the wide parts 7a are connected to each other via the conductive layer 14. Hence, it is not necessary to provide another area for the well contact. Consequently, a chip area can be reduced. Further, although resistance exists on the element separating shield electrodes 7 as well, two points on the single element separating shield electrode 7 are connected to the first metal wire layer 17a. Thus, even when a signal is sent to a signal line around the element separating shield electrode 7, a potential thereof is stable. Consequently, it is possible to eliminate a writing error and a reading error. Moreover, more than two connecting points may be provided.

Furthermore, when the contact hole reaching the wide part 7a is formed in the first interlayer insulating film 13, normal plasma etching is adopted. However, the contact hole is formed in an overlapping part of the thick peripheral element separation insulating film 9, not in a part of the thin gate oxide film (tunnel oxide film) 12. Hence, it is possible to prevent dielectric breakdown on the gate insulating film 12 by application of plasma so as to secure high reliability.

Additionally, in the above embodiment, the element separating shield electrodes 7 are connected to the first metal wire layers 17a, each being equal to the well in potential and serving as a main source line. It is also possible to provide another wire layer via the conductive layer 14 and to make direct connection with the well.

Also, such a nonvolatile semiconductor memory is applicable to a mask ROM, an NAND flash memory, an AND flash memory and the like. However, the application is not particularly limited.

As described above, the present invention makes it possible to prevent the occurrence of misalignment, so that the source diffusion layer and the drain diffusion layer do not require a margin, which has been necessary in a conventional cell transistor. Therefore, a memory cell region can be reduced.

Further, an ordinary method such as LOCOS method and trench insulating separation may be adopted for separating elements of the peripheral circuit, so that the peripheral circuit can be readily formed.

Moreover, with an overlapping region of the element separating shield electrode and the element separation insulating film, even when a contact hole reaching the element separating shield electrode is formed by plasma etching, it is possible to prevent dielectric breakdown on a thin tunnel insulating film and the like, thereby improving reliability. Furthermore, an overlapping region is provided between the element separating shield electrode and the element separation insulating film 9, so that electrical separation is possible between the adjacent diffusion layers and between the memory cell region and the peripheral circuit region in transistors. Consequently, a stable circuit operation can be achieved.

What is claimed is:

1. A semiconductor memory comprising:
   a memory cell region including:
      semiconductor memory cells arranged in an array; and
      element separating shield electrodes which extend in a column direction and separate semiconductor memory cells being adjacent to each other in a row direction, a bias voltage being applied to said element separating shield electrodes throughout operation of said memory cell region to maintain insulating separation between a source diffusion layer and a drain diffusion layer of each two adjacent columns of said semiconductor memory cells; and a peripheral circuit region including:

a peripheral circuit sending and receiving data to and from said semiconductor memory cell; and an element separation insulating film which separates elements in said peripheral circuit, said element separating shield electrodes extending onto said element separation insulating film at a boundary between said memory cell region and said peripheral circuit region.

2. The semiconductor memory according to claim 1, further comprising:

an interlayer insulating film formed on said semiconductor memory cells and said element separating shield electrodes;

a metal layer being formed on said interlayer insulating film and being connected to a semiconductor substrate or a well on which said semiconductor memory cells are formed; and a connecting conductive layer which penetrates said interlayer insulating film and connects said element separating shield electrodes and said metal layer on a region where said element separating shield electrodes and said element separation insulating film overlap each other.

3. The semiconductor memory according to claim 2, wherein said connecting conductive layer is connected to at least two portions of said metal layer.

4. The semiconductor memory according to claim 2, wherein said metal layer is connected to a metal wire through which source potential is supplied to said memory cells.

5. The semiconductor memory according to claim 1, wherein said element separation insulating film is a kind of insulating film selected from a group consisting of a LOCOS insulating film, a recess LOCOS insulating film and a trench insulation separating film.

6. A manufacturing method of said semiconductor memory according to claim 1 comprising the steps of:

forming a gate conductive layer on a semiconductor substrate, all gate electrodes of said semiconductor memory cells and all of said element separating shield electrodes being integrated on said gate conductive layer; and forming said source diffusion layer and said drain diffusion layer of said semiconductor memory cells by ion implantation into said semiconductor substrate using said gate conductive layer as a mask.

7. The manufacturing method according to claim 6, further comprising the step of dividing said gate conductive layer to said gate electrodes and said element separating shield electrodes after said ion implantation.

8. The manufacturing method according to claim 6, further comprising the step of forming said element separation insulating film for said peripheral circuit, before forming said gate conductive layer.

9. The manufacturing method according to claim 8, wherein said element separation insulating film is formed by a method selected from a group consisting of LOCOS method, recess LOCOS method, and trench insulation separating method.

10. The manufacturing method according to claim 8, wherein said step of forming said gate conductive layer is a step of extending parts serving as said element separating shield electrodes of said gate conductive layer onto said element separation insulating film at a boundary between said memory cell region and said peripheral circuit region.

11. The manufacturing method according to claim 10, further comprising the steps of:

forming an interlayer insulating film at least in said memory cell region;

forming a contact hole reaching said element separating shield electrode on a region where said element separating shield electrodes and said element separation insulating film overlap each other in said interlayer insulating film; and embedding a conductive layer into said contact hole.

12. The manufacturing method according to claim 11, further comprising the step of forming a wire layer which connects said conductive layer and a well or a semiconductor substrate on which said semiconductor memory cells are formed.

13. The manufacturing method according to claim 11, further comprising the step of forming a metal layer on said interlayer insulating film, said metal layer being connected to a well on which said memory cells are formed, so that said conductive layer is connected to said well via said metal layer.

* * * * *